(12) United States Patent
Matthews

(10) Patent No.: US 6,222,793 B1
(45) Date of Patent: Apr. 24, 2001

(54) MEMORY DEVICES HAVING A RESTORE START ADDRESS COUNTER

(75) Inventor: Frank Matthews, Alpharetta, GA (US)

(73) Assignee: Intergrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/587,930

(22) Filed: Jun. 6, 2000

(51) Int. Cl.[7] .................................................... G11C 8/00

(52) U.S. Cl. ............... 365/236; 365/230.05; 365/230.03; 365/221

(58) Field of Search ............................. 365/236, 230.05, 365/221, 230.02, 189.04, 219, 189.12, 233

(56) References Cited

U.S. PATENT DOCUMENTS

| | | | |
|---|---|---|---|
| 4,633,441 | 12/1986 | Ishimoto | 365/189 |
| 5,365,485 | 11/1994 | Ward et al. | 365/221 |
| 6,011,751 * | 1/2000 | Hirabayashi | 365/236 |

OTHER PUBLICATIONS

High–Speed 32K ×8 Synchronous Pipelines Dual–Port Static RAM, 1997 Communications Products Data Book Including Specialized Memories: Dual–Port and Multi–Port Memories, FIFOs, ATM Products & Modules, pp. 1–14 (Oct. 1996).

* cited by examiner

*Primary Examiner*—David Nelms
*Assistant Examiner*—David Lam
(74) *Attorney, Agent, or Firm*—Myers Bigel Sibley & Sajovec, P.A.

(57) ABSTRACT

Embodiments of the present invention may provide methods of controlling a memory device and memory devices including a memory array having an internal address input which specifies a location in the memory array accessed during read operations and write operations. An external address input receives an address value from a device external to the memory device. The received address value may be utilized to randomly access the memory array. An address register/restart address counter is operatively associated with the memory array and the external address input and configured to store a start address for at least a write operation to the memory array, to selectively generate a series of internal addresses to access the memory array based on the stored start address and to selectively return to the stored start address as a start address of a subsequent operation to access the memory array.

35 Claims, 5 Drawing Sheets

MEMORY DEVICES HAVING A RESTORE START ADDRESS COUNTER

FIELD OF THE INVENTION

The present invention relates to integrated circuit devices, and more particularly to memory devices.

BACKGROUND OF THE INVENTION

Memory devices typically store (write) and retrieve (read) data from a memory array based on an address. In conventional memory devices, such as the synchronous dual port memory device 10 illustrated in FIG. 1, the address utilized for a read or write operation may be either an external address or an internally generated count which originates at a loaded address or a zero address. As is seen in FIG. 1, the dual port memory device 10 includes a memory array 12, I/O controls 14 and 14', input latches 18 and 18', drivers 20 and 20', read/write control latches 22 and 22', and NOR gates 24 and 24' which control the drivers 20 and 20' to activate during read operations, AND gates 26 and 26' which provide a read/write control signal to the I/O controls 14 and 14', chip enable control gates 28 and 28' and chip enable latches 30 and 30'.

Also provided are counter/address registers 16 and 16'. The counter/address registers 16 and 16' latch the address on the external address bus of the device for read and write operations and provide this address to the memory array 12. The counter/address registers 16 and 16' also provide an internally generated count to the memory array as an address. The count may be reset to 0 by the $\overline{\text{CNTRST}}$ signal and started by the signal $\overline{\text{CNTEN}}$. The memory array 12 may then be sequentially accessed, beginning with an externally loaded address or 0 by incrementing the count.

FIG. 2 illustrates a possible circuit to carry out the functions of the counter/address registers 16 and 16'. As seen in FIG. 2, a multiplexer 32 receives the external address $A_0-A_{15}$ as one input. The multiplexer 32 is controlled by the $\overline{\text{ADS}}$ signal so that when $\overline{\text{ADS}}$ is active, the multiplexer 32 outputs the external address. A second multiplexer 34 receives the output of the first multiplexer 32 and outputs either the output of the first multiplexer 32 or all 0's based on the signal $\overline{\text{CNTRST}}$. If $\overline{\text{CNTRST}}$ is active, then all 0's are output and if $\overline{\text{CNTRST}}$ is inactive, then the output of the second multiplexer 34 is the output of the first multiplexer 32. The output of the second multiplexer 34 is provided to a counter/register 36 which stores the output of the multiplexer 34 on each cycle of CLK. The output of the counter/register 36 is provided to the memory array 12 and also provided to an adder 38 and a third multiplexer 40. The adder 38 increments the address value output by the counter/register 36 by 1 and provides that value to the third multiplexer 40. The third multiplexer 40 provides its output to the first multiplexer 32. The output of the third multiplexer 40 is controlled by the signal $\overline{\text{CNTEN}}$ to output the value of the counter/register 36 if $\overline{\text{CNTEN}}$ is inactive and the incremented value of the counter/register 36 if $\overline{\text{CNTEN}}$ is active.

A truth table for the address counter control is illustrated in Table 1.

TABLE 1

Address Counter Control

| Address | Previous Address | CLK | $\overline{\text{ADS}}$ | $\overline{\text{CNTEN}}$ | $\overline{\text{CNTRST}}$ | I/O | MODE |
| --- | --- | --- | --- | --- | --- | --- | --- |
| X | X | ↑ | H | H | L | Dout (0) | Counter reset to Address 0 |
| An | X | ↑ | L | H | H | Dout (n) | External Address Utilized |
| X | An | ↑ | H | H | H | Dout (n) | External Address Blocked - Counter disabled |
| X | An | ↑ | H | L | H | Dout (n+1) | Counter Enabled - Internal Address generation |

As is seen in the above truth table and from the circuit illustrated in FIG. 2, the address may be reset to Address 0 but may not be reset to an externally loaded address. To restart a read or a write operation which utilized internal address generation at an address other than 0, a new address is loaded from the external address bus. Accordingly, an additional address cycle may be required to restart any non-zero operations. Thus, if a write operation is immediately followed by a read or a series of read operations from the same initial non-zero or intermediate starting address, the initial starting address will be loaded for each operation. Additional dual port memory devices having a loadable address for read operations are illustrated in U.S. Pat. No. 4,633,441.

In other devices, such as first-in-first-out (FIFO) buffers, internal addresses may be utilized to access memory. These pointers to memory may be utilized to track the sequence in which data is stored in memory to create a FIFO from a random access memory. In particular in FIFOs with a "fast retransmit mode," a read address may be stored and used as a mark to return to begin transmission. Typically, this read address does not correspond to an external address and the FIFO typically reads to this address and then sets a mark to begin retransmission. An example of such a FIFO is illustrated in U.S. Pat. No. 5,365,485.

SUMMARY OF THE INVENTION

Embodiments of the present invention may provide methods of controlling a memory device and memory devices including a memory array having an internal address input which specifies a location in the memory array accessed during read operations and write operations. An external address input receives an address value from a device external to the memory device. The received address value may be utilized to randomly access the memory array. An address register/restart address counter is operatively associated with the memory array and the external address input and configured to store a start address for at least a write operation to the memory array, to selectively generate a series of internal addresses to access the memory array based on the stored start address and to selectively return to the stored start address as a start address of a subsequent operation to access the memory array.

In particular embodiments of the present invention, the address register/restart address counter includes a register operatively connected to the external address input and configured to selectively store address values received at the external address input. A loadable counter having an input operatively associated with the register and the external address input so as to allow the selective loading of address values received by the external address input and address values stored in the register and having an output operatively associated with the memory device so as to provide the internal address values to the memory array may also be included. A counter restart input is operatively associated with the loadable counter so as to load the counter with an address value stored in the register when the counter restart input is active.

In still further embodiments of the present invention, a counter enable input is operatively associated with the loadable counter. The loadable counter may then be configured to increment from the loaded address value when the counter enable input is active. In particular embodiments, the register may also be configured to store each address value received on the external address input as a start address for at least a write memory operation. Preferably, however, the register is configured to store each address value received on the external address input as a start address irrespective of whether a memory operation is a read memory operation or a write memory operation.

In still further embodiments of the present invention, the loadable counter is configured to be restarted to the address stored in the register by the counter restart input without receiving an address value on the external address input so as to perform a memory operation utilizing the stored address value and without receiving an external address. In such embodiments, the address value stored in the register may be a start address value of a write memory operation and the memory operation performed utilizing the stored address value and without receiving an external address may be a read memory operation.

In a particular preferred embodiment of the present invention, the address register/restart counter includes a first multiplexer which receives as an input the external address and selectively provides received inputs as an output, a second multiplexer which receives the output of the first multiplexer as an input and selectively provides received inputs as an output and a counter/register which receives the output of the second multiplexer and stores the received output of the second multiplexer. An adder receives the output of the counter/register and increments a value corresponding to the output of the counter/register to provide an output. A third multiplexer receives the output of the adder and the output of the counter/register and selectively provides one of the output of the adder and the output of the counter/register as an input to the first multiplexer. A fourth multiplexer receives the external address as an input and selectively provides received inputs as an output. A register which receives the output of the fourth multiplexer, stores the received output and provides the stored received output as an input to the fourth multiplexer and an input to the second multiplexer. Preferably, the first and fourth multiplexers are both controlled by an address select signal. For example, the address select signal may be an address strobe which indicates a valid external address for both read and write operations.

In certain embodiments of the present invention, the memory device is a dual port memory device. Alternatively, the memory device may be a multi-port memory device.

In further embodiments of the present invention, a memory device may be controlled by receiving at the memory device non-zero start address for a block write operation. The non-zero start address for the block write operation is stored at the memory device. The block write operation is performed from the non-zero start address. A subsequent block memory operation is performed from the non-zero start address utilizing the non-zero start address stored at the memory device as the start address of the block memory operation. In particular embodiments, the subsequent block memory operation is a read block memory operation. Alternatively, the subsequent block memory operation may be a write block memory operation.

In further embodiments of the present invention, the block write operation from the non-zero start address may be performed by storing the non-zeros start address as a write address to access a memory array of the memory device. Data is written to memory at the write address. Then, the write address is incremented. The writing of data and incrementing of the write address are carried out until the block memory operation is completed. The subsequent block memory operation from the non-zero start address stored at the memory device may be performed by storing the non-zero start address as a memory address to access a memory array of the memory device. Then a memory operation is performed using the memory address and the memory address incremented. The memory operation and the incrementing of the memory address are carried out until the block memory operation is completed. In particular embodiments, the block memory operation is a write operation. Alternatively, the block memory operation may be a read operation.

In still further embodiments of the present invention, memory operations in a memory device may be controlled by receiving at the memory device a first non-zero start address for a block write operation, storing the first non-zero start address for the block write operation at the memory device, performing the block write operation from the first non-zero start address and performing a first subsequent block memory operation from the first non-zero start address utilizing the first non-zero start address stored at the memory device as the start address of the first subsequent block memory operation. A second non-zero start address for a second block write operation which is different from the first non-zero start address is also received at the memory device. The second non-zero start address for the block write operation is stored at the memory device and the second block write operation performed from the second non-zero start address. A second subsequent block memory operation is also performed from the second non-zero start address utilizing the second non-zero start address stored at the memory device as the start address of the second subsequent block memory operation.

As will be appreciated by those of skill in the art, the present invention may be embodied as memory devices and/or methods or systems for controlling memory devices.

DESCRIPTION OF PREFERRED
EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
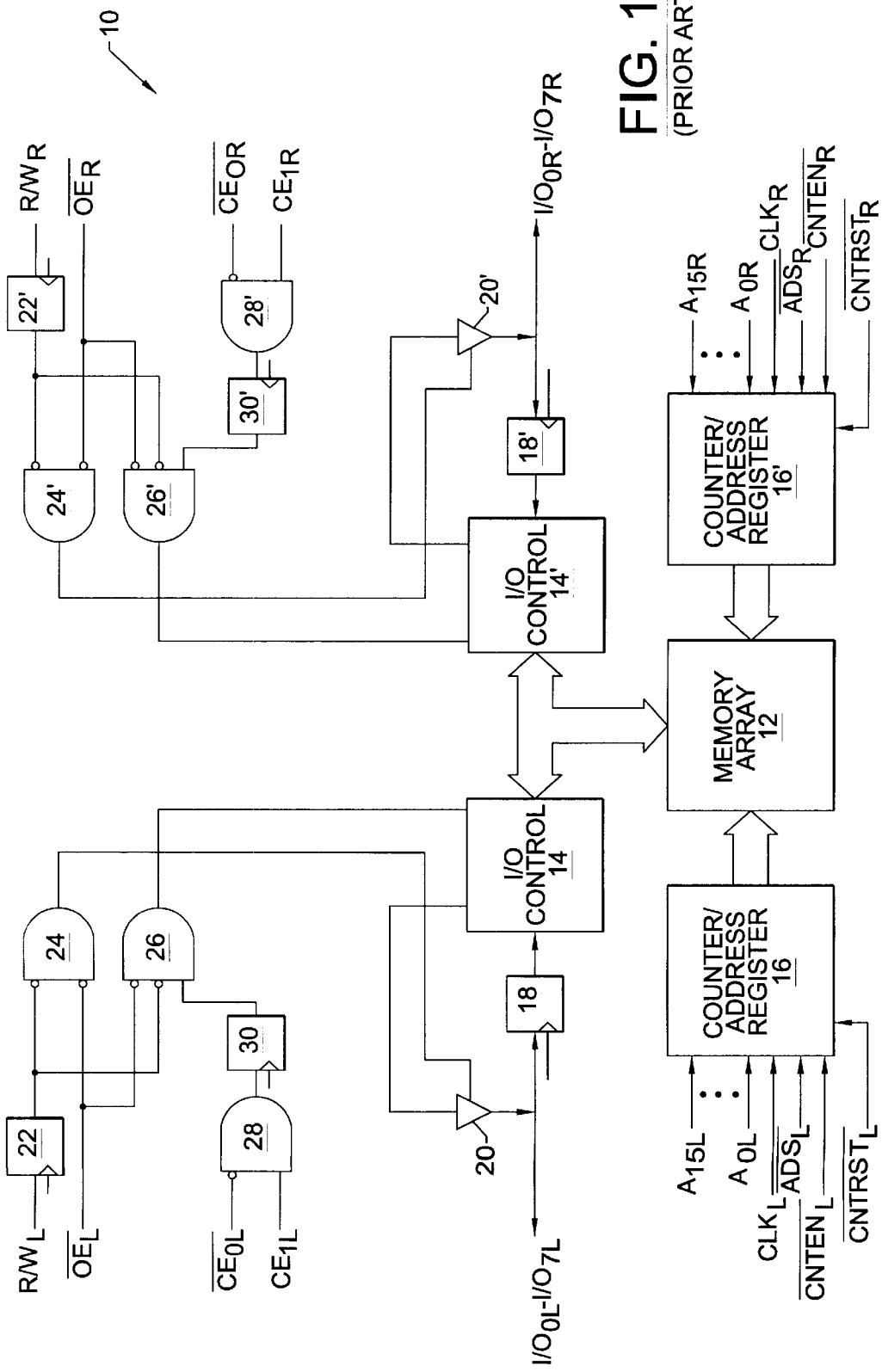
FIG. 1 is a block diagram of a conventional dual port memory device.
Figure 2:
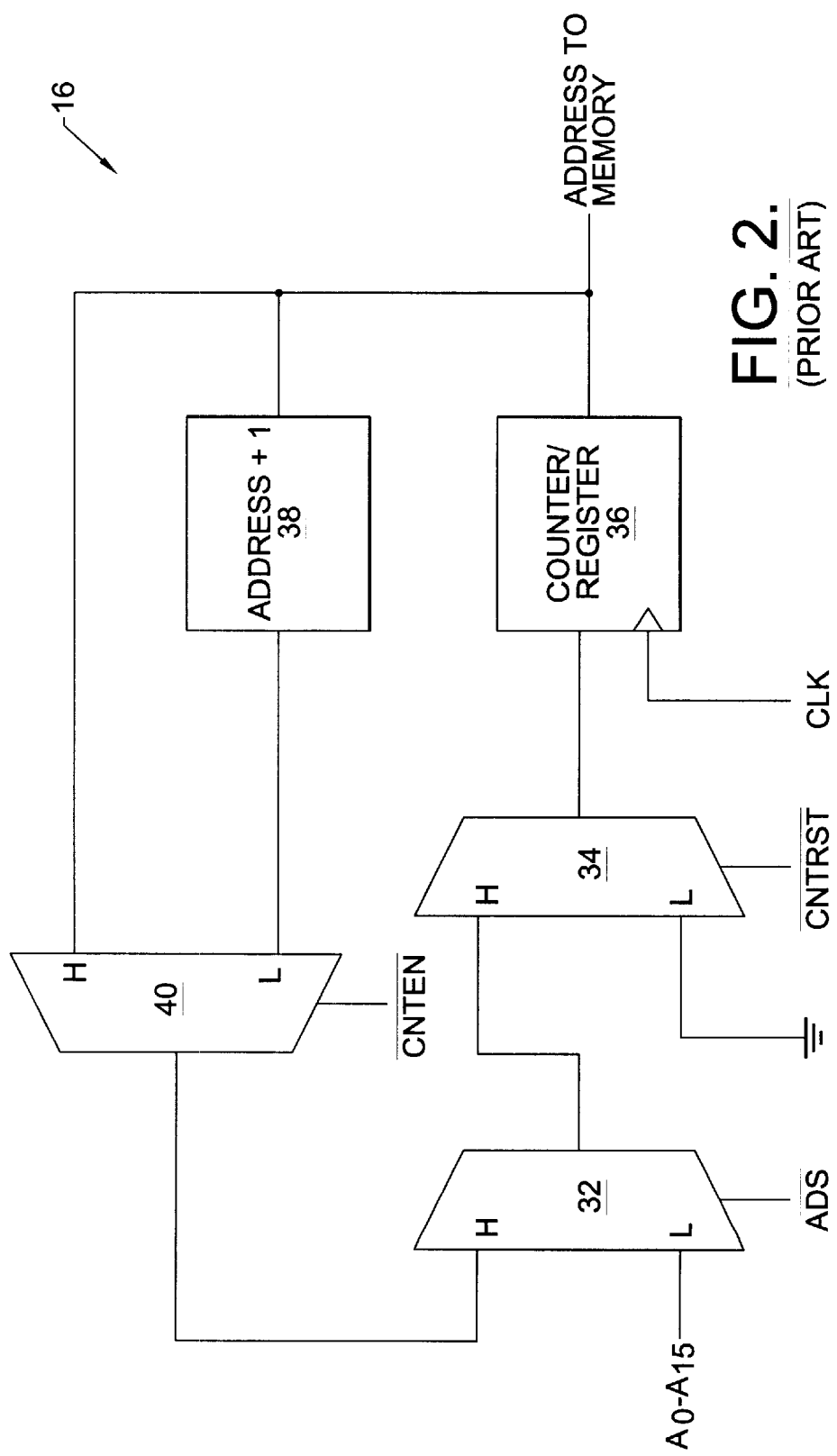
FIG. 2 is a block diagram of a counter/address register of a conventional dual port memory device.
Figure 3:
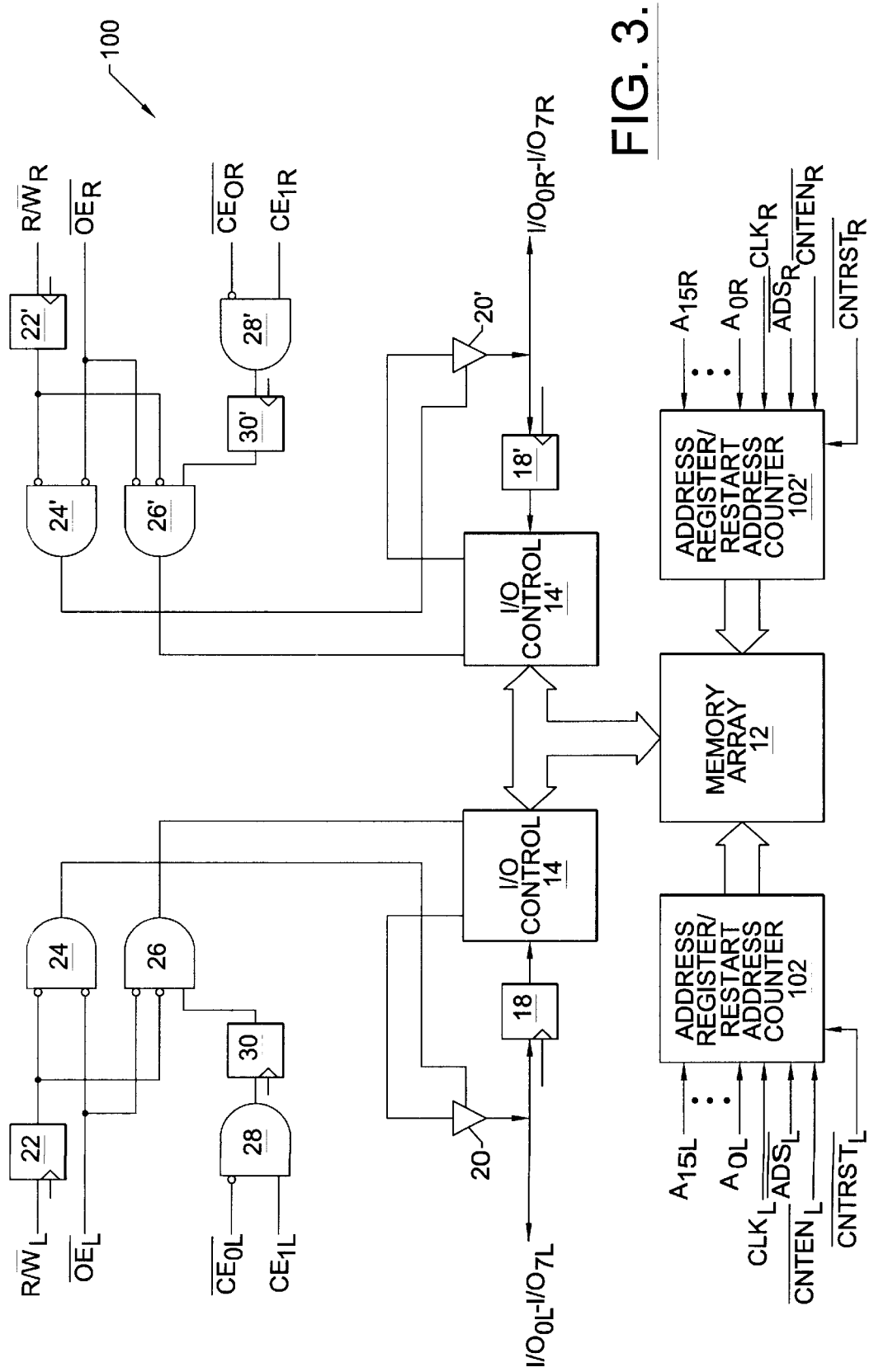
FIG. 3 is a block diagram of a memory device according to embodiments of the present invention.
Figure 4:
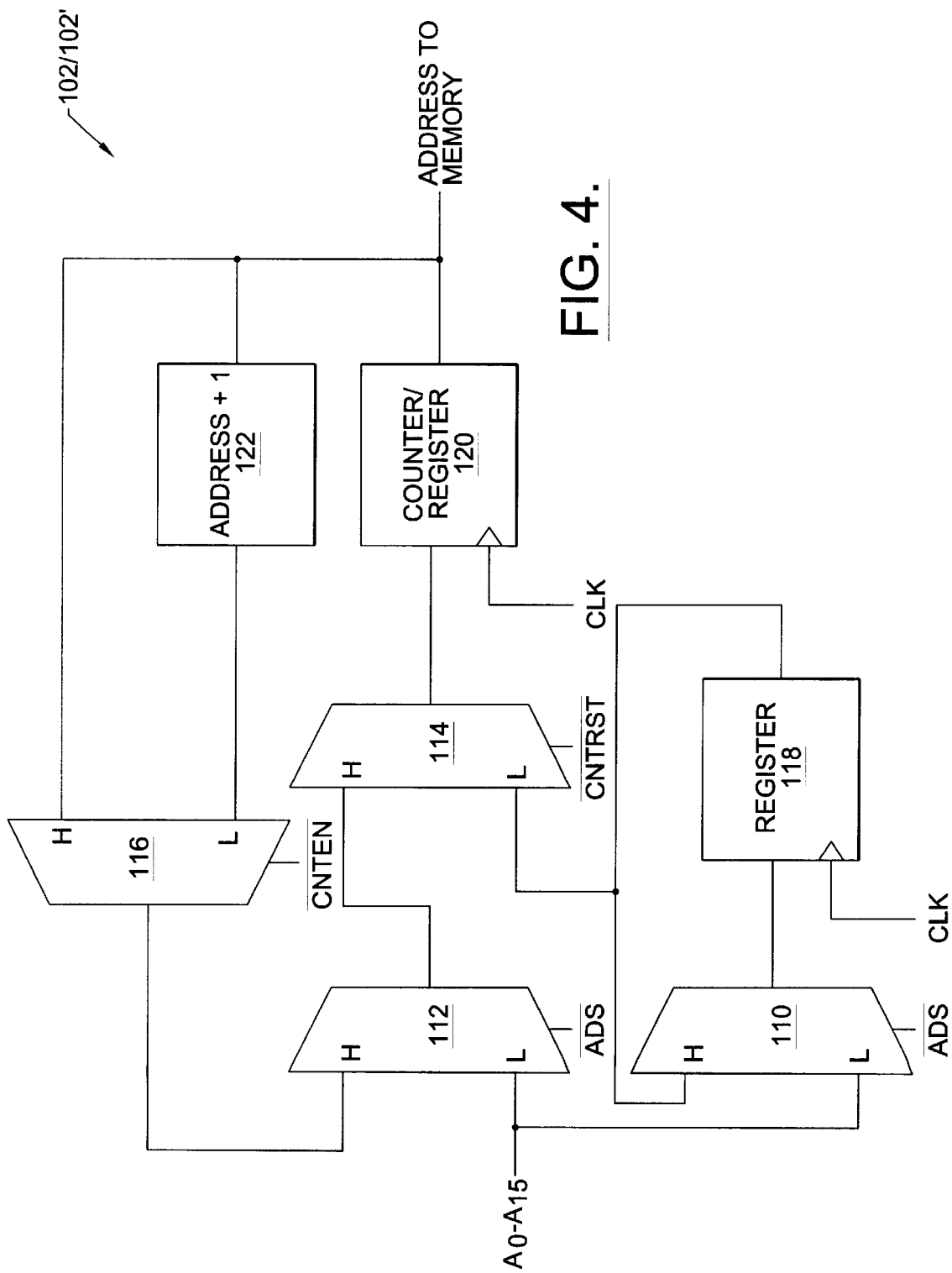
FIG. 4 is a block diagram of a address register/restart address counter according to embodiments of the present invention.

Referring now to FIGS. 3 and 4, preferred devices according to embodiments of the present invention will be described. FIG. 3 illustrates a dual port memory device 100 according to embodiments of the present invention. As is further seen in FIG. 3, the counter/address registers 16 and 16' of FIG. 1 have been replaced by the address register/restart address counters 102 and 102'. Otherwise, the operations of the dual port memory 100 may be performed in the same manner as a conventional dual port memory. Thus, for example, the I/O controls 14 and 14' may operate in a conventional manner. Accordingly, operations of the dual port memory 100 other than the operations of the address register/restart address counters 102 and 102' may be carried out as in the conventional dual port memory 10 and will, therefore, not be described further herein.

The address register/restart address counters 102 and 102' according to embodiments of the present invention allow a start address of a memory operation to be stored and then subsequent memory operations utilize the stored start address as a start address. Thus, for example, during a write operation, the start address may be loaded and the write operation performed. Subsequently, another write operation could restart the address register/restart address counters to the previously loaded start address. The subsequent write operation could then proceed without the need for an address cycle. Similarly, a subsequent read operation could proceed without the need for an address cycle by resetting the address register/restart address counters to the previously loaded start address. As will be appreciated by those of skill in the art, the present invention may be particularly well suited to block memory operations. As used herein, the term "block memory operation" refers to a memory operation which access more than one memory address. However, the present invention may be utilized in memory operations which access only a single memory address.

In the particular embodiments illustrated in FIG. 3, the address register/restart address counters 102 and 102' latch the address on the external address bus of the memory device 100 for at least write operations and, preferably, for read and write operations and provide this address to the memory array 12. As will be appreciated by those of skill in the art, the memory array 12 may address decoders and/or predecoders, such as row and/or column decoders so as to address particular elements in the array based on the address provided to the memory array 12. The address register/restart address counters 102 and 102' also provide an internally generated address to the memory array where the internally generated address begins at an address provided on the address bus $A_0$–$A_{15}$ or a previously stored address. An address may be stored as a start address each time the $\overline{ADS}$ signal is active. Alternatively, a separate signal could be provided and utilized to store an address on the address bus $A_0$–$A_5$ as a start address. The start address for an operation may be reset to the stored start address by the $\overline{CNTRST}$ signal and incremented by the signal $\overline{CNTEN}$. The memory array 12 may then be sequentially accessed beginning with an externally loaded address or with the loaded start address.

FIG. 4 illustrates a possible circuit to carry out the functions of the address register/restart address counters 102 and 102'. As seen in FIG. 4, a first multiplexer 112 receives the external address $A_0$–$A_{15}$ as one input. The multiplexer 112 is controlled by the $\overline{ADS}$ signal so that when $\overline{ADS}$ is active, the multiplexer 112 outputs the external address. A second multiplexer 114 receives the output of the first multiplexer 112 and outputs either the output of the first multiplexer 112 or the output of an address register 118 based on the signal $\overline{CNTRST}$. If $\overline{CNTRST}$ is active, then the address register 118 output is output by the second multiplexer 114 and if $\overline{CNTRST}$ is inactive, then the output of the first multiplexer 112 is output by the second multiplexer 114. The output of the second multiplexer 114 is provided to a counter/register 120 which stores the output of the multiplexer 114 on each cycle of CLK. The output of the counter/register 120 is provided to the memory array 12 and also provided to an adder 122 and a third multiplexer 116. The adder 122 may increment the address value output by the counter/register 120 by 1 and provides that value to the third multiplexer 116. The third multiplexer 116 provides its output to the first multiplexer 112. The output of the third multiplexer 116 is controlled by the signal $\overline{CNTEN}$ to output the value of the counter/register 120 if $\overline{CNTEN}$ is inactive and the incremented value of the counter/register 120 if $\overline{CNTEN}$ is active.

Also provided is a fourth multiplexer 110 which receives as an input the address bus $A_0$–$A_{15}$ and the output of the register 118. The fourth multiplexer is controlled by the $\overline{ADS}$ signal so that when $\overline{ADS}$ is active, the address bus $A_0$–$A_{15}$ is passed to the output of the fourth multiplexer 110. When $\overline{ADS}$ is inactive, the output of the register 118 is output from the fourth multiplexer 110. Thus, when $\overline{ADS}$ is active, the register 118 is loaded with the address on the address bus and when $\overline{ADS}$ is inactive, the register 118 loads with its current value. Accordingly, the last loaded address value may be stored in the register 118 for subsequent use as a restart address.

A truth table for the address counter control is illustrated in Table 2.

TABLE 2

Address Register/Start Address Counter Control

| Address | Previous Address | CLK | $\overline{ADS}$ | $\overline{CNTEN}$ | $\overline{CNTRST}$ | I/O | MODE |
|---|---|---|---|---|---|---|---|
| X | An | ↑ | H | H | L | Dout (n) | Counter reset to Start Address |
| An | X | ↑ | L | H | H | Dout (n) | External Address Utilized |
| X | An | ↑ | H | H | H | Dout (n) | External Address Blocked - Counter disabled |
| X | An | ↑ | H | L | H | Dout (n+1) | Counter Enabled - Internal Address generation |

As is seen in the above truth table and from the circuit illustrated in FIG. 4, the address used to access memory may be reset to a previous start address. Thus, a read or a write operation which utilized internal address generation may start from a non-zero address without a new address being loaded from the external address bus. Accordingly, an address cycle may be eliminated from subsequent operations which utilize a previous start address as a start address. Thus, if a write operation is immediately followed by a read or a series of read operations from the same initial non-zero or intermediate starting address, the initial starting address may be set to the stored address and an address cycle eliminated from the subsequent read operation(s).

While the present invention has been described with reference to a particular multiplexer/register arrangement, as will be appreciated by those of skill in the art, other circuits may be utilized for carrying out the functions of the present invention. For example, the fourth multiplexer 110 may be replaced by a gating circuit which gates the CLK signal or a version of the CLK signal with the ADS signal so as to provide the clock for the register 118. Thus, the register 118 would only be loaded when the ADS signal was active. Alternatively, a loadable counter where the count was selectively enabled could be utilized to replace the counter/register 120, the adder 122 and the multiplexer 116. Thus, the present invention should not be construed as limited to the particular embodiments of the present invention illustrated in the figures but is intended to cover all circuits for carrying out the operations described herein for utilizing a restart address stored on a memory device where the stored address may be loaded at least during a write operation. Preferably, however, the stored address may be loaded during a read or a write operation.

Figure 5:
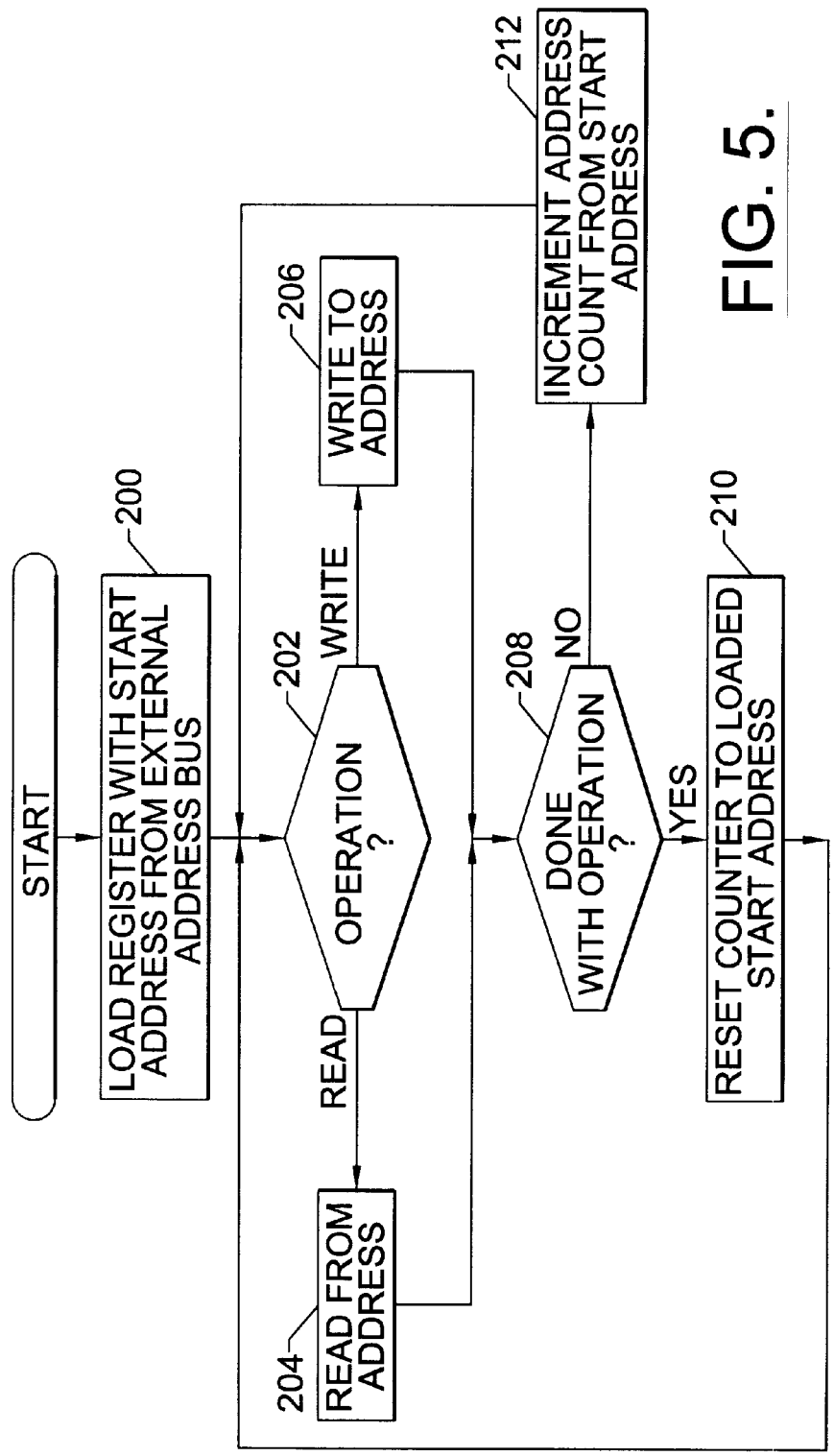
FIG. 5 is a flowchart illustrating operations of a memory device according to embodiments of the present invention.

FIG. 5 is a flowchart illustrating operations which may be carried out according to embodiments of the present invention. As will be appreciated by those of skill in the art, circuitry may be provided for carrying out these operations so as to provide means for carrying out the operations of a block or blocks in the flowchart illustration. Thus, embodiments of the present invention may be embodied as methods including some or all operations illustrated in the flowchart illustrations or memory devices having circuitry which provides means for carrying out some or all of the operations illustrated in the flowchart illustrations.

As seen in FIG. 5, a register is loaded with a start address from an external bus so as to store an address received on the external bus (block 200). Means for storing a start address may be provided by the circuitry illustrated in FIG. 4 or by other circuitry, such as a register or other storage device which may store received address information based on interface control signals. After the start address is stored, if the operation is a write operation (block 202), a write is performed to a current address (block 206) and if the operation is a read operation (block 202) a read is performed from the current address (block 204). The current address may be an address loaded in the counter/register 120 or other such current address register which may provide an address to the memory array 12. If the write or read operation is complete (block 208), the current address may be reset to the start address previously stored (block 210). Resetting the start address may be accomplished, for example, by the output of register 118 being provided through multiplexer 114 to counter/register 120. Otherwise, the current address is incremented from the start address (block 212) and the write or read performed to/from the next address (blocks 202, 206 and 204). The increment of the start address may be carried out, for example, by the adder 122 and the multiplexers 116, 112 and 114. These operations may be repeated until the operation is complete (block 208).

Because the current address may be reset to the loaded start address (block 210), a subsequent read or write operation need not load the start address again. Furthermore, because the start address may be stored for a write operation, successive write operations may be performed without the need to reload the start address. Successive read operations may also be performed following a write operation without reloading a start address. In preferred embodiments of the present invention where the start address is stored irrespective of whether the operation is a read or a write operation, combinations of read and write operations may be performed without the need to reload the start address register.

While the present invention has been described with reference to dual port memory devices, as will be appreciated by those of skill in the art, the present invention may be applicable to other memory devices, including single port memory devices. The present invention may also be applicable to multi-port memory devices such as those described in U.S. Pat. No. 5,999,478, the disclosure of which is incorporated herein by reference as if set forth fully herein. Accordingly, the present invention should not be construed as limited to the particular dual port devices described herein but may be incorporated into any memory device which may receive an external address and which may perform a block memory operation or non-block memory operation as well.

Furthermore, the present invention has been described with reference to a 16 bit address. As will be appreciated by those of skill in the art, other address sizes may be utilized based on the size of the memory device. Accordingly, the present invention should not be construed as limited to particular address sizes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A memory device comprising:
   a memory array having an internal address input which specifies a location in the memory array accessed during read operations and write operations;
   an external address input which receives an address value from a device external to the memory device, wherein the received address value is utilized to randomly access the memory array; and
   an address register/restart address counter operatively associated with the memory array and the external address input and configured to store a start address for at least a write operation to the memory array, to selectively generate a series of internal addresses to access the memory array based on the stored start address and to selectively return to the stored start address as a start address of a subsequent operation to access the memory array.

2. A memory device according to claim 1, wherein the address register/restart address counter comprises:
   a register operatively connected to the external address input and configured to selectively store address values received at the external address input;
   a loadable counter having an input operatively associated with the register and the external address input so as to allow the selective loading of address values received by the external address input and address values stored in the register and having an output operatively associated with the memory device so as to provide the internal address values to the memory array; and
   a counter restart input operatively associated with the loadable counter so as to load the counter with an address value stored in the register when the counter restart input is active.

3. A memory device according to claim 2, further comprising:
   a counter enable input operatively associated with the loadable counter; and
   wherein the loadable counter is configured to increment from the loaded address value when the counter enable input is active.

4. A memory device according to claim 3, wherein the register is configured to store each address value received on the external address input as a start address for at least a write memory operation.

5. A memory device according to claim 4, wherein the register is configured to store each address value received on the external address input as a start address irrespective of whether a memory operation is a read memory operation or a write memory operation.

6. A memory device according to claim 3, wherein the loadable counter is configured to be restarted to the address stored in the register by the counter restart input without receiving an address value on the external address input so as to perform a memory operation utilizing the stored address value and without receiving an external address.

7. A memory device according to claim 6, wherein the address value stored in the register is a start address value of a write memory operation and where the memory operation performed utilizing the stored address value and without receiving an external address is a read memory operation.

8. A memory device according to claim 1, wherein the address register/restart counter comprises:

a first multiplexer which receives as an input the external address and selectively provides received inputs as an output;

a second multiplexer which receives the output of the first multiplexer as an input and selectively provides received inputs as an output;

a counter/register which receives the output of the second multiplexer and stores the received output of the second multiplexer;

an adder which receives the output of the counter/register and increments a value corresponding to the output of the counter/register to provide an output;

a third multiplexer which receives the output of the adder and the output of the counter/register and which selectively provides one of the output of the adder and the output of the counter/register as an input to the first multiplexer;

a fourth multiplexer which receives the external address as an input and selectively provides received inputs as an output; and a register which receives the output of the fourth multiplexer, stores the received output and provides the stored received output as an input to the fourth multiplexer and an input to the second multiplexer.

9. A memory device according to claim 8, wherein the first and fourth multiplexers are both controlled by an address select signal.

10. A memory device according to claim 9, wherein the address select signal is an address strobe which indicates a valid external address for both read and write operations.

11. A memory device according to claim 1, wherein the memory device is a dual port memory device.

12. A memory device according to claim 1, wherein the memory device is a multi-port memory device.

13. A method of controlling memory operations in a memory device, the method comprising the steps of:

receiving at the memory device a non-zero start address for a block write operation;

storing the non-zero start address for the block write operation at the memory device;

performing the block write operation from the non-zero start address; and performing a subsequent block memory operation from the non-zero start address utilizing the non-zero start address stored at the memory device as the start address of the block memory operation.

14. A method according to claim 13, wherein the subsequent block memory operation is a read block memory operation.

15. A method according to claim 13, wherein the subsequent block memory operation is a write block memory operation.

16. A method according to claim 13, wherein the step of performing the block write operation from the non-zero start address comprises the steps of:

storing the non-zero start address as a write address to access a memory array of the memory device; then writing data to memory at the write address; then incrementing the write address; and wherein the steps of incrementing the write address and writing data to memory are carried out until the block memory operation is completed.

17. A method according to claim 16, wherein the step of performing a subsequent block memory operation from the non-zero start address stored at the memory device comprises the steps of:

storing the non-zero start address as a memory address to access a memory array of the memory device; then performing a memory operation using the memory address; then incrementing the memory address; and wherein the steps of incrementing the memory address and performing a memory operation are carried out until the block memory operation is completed.

18. A method according to claim 17, wherein the block memory operation is a write operation.

19. A method according to claim 17, wherein the block memory operation is a read operation.

20. A memory device, comprising:

means for receiving at the memory device a non-zero start address for a block write operation;

means for storing the non-zero start address for the block write operation at the memory device;

means for performing the block write operation from the non-zero start address; and means for performing a subsequent block memory operation from the non-zero start address utilizing the non-zero start address stored at the memory device as the start address of the block memory operation.

21. A memory device according to claim 20, wherein the subsequent block memory operation is a read block memory operation.

22. A memory device according to claim 20, wherein the subsequent block memory operation is a write block memory operation.

23. A memory device according to claim 20, wherein the means for performing the block write operation from the non-zero start address comprises:

means for storing the non-zero start address as a write address to access a memory array of the memory device;

means for writing data to memory at the write address;

means for incrementing the write address; and means for controlling the means for writing data and the means for incrementing the write address so as to write data to memory and increment the write address until the block memory operation is completed.

24. A memory device according to claim 23, wherein means for performing a subsequent block memory operation from the non-zero start address stored at the memory device comprises:

means for storing the non-zero start address as a memory address to access a memory array of the memory device;

means for performing a memory operation using the memory address;

means for incrementing the memory address; and means for controlling the means for performing a memory operation and the means for incrementing the memory address so as to perform a memory operation and increment the memory address until the block memory operation is completed.

25. A memory device according to claim 24, wherein the block memory operation is a write operation.

26. A memory device according to claim 24, wherein the block memory operation is a read operation.

27. A memory device according to claim 20, wherein the memory device comprises a dual port memory device.

28. A memory device according to claim 20, wherein the memory device comprises a multi-port memory device.

29. A method of controlling memory operations in a memory device, the method comprising the steps of:

receiving at the memory device a first non-zero start address for a block write operation;

storing the first non-zero start address for the block write operation at the memory device;

performing the block write operation from the first non-zero start address;

performing a first subsequent block memory operation from the first non-zero start address utilizing the first non-zero start address stored at the memory device as the start address of the first subsequent block memory operation;

receiving at the memory device a second non-zero start address for a second block write operation which is different from the first non-zero start address;

storing the second non-zero start address for the block write operation at the memory device;

performing the second block write operation from the second non-zero start address; and performing a second subsequent block memory operation from the second non-zero start address utilizing the second non-zero start address stored at the memory device as the start address of the second subsequent block memory operation.

30. A method according to claim 29, wherein at least one of the first subsequent block memory operation and the second block memory operation is a read block memory operation.

31. A method according to claim 29, wherein at least one of the first subsequent block memory operation and the second subsequent block memory operation is a write block memory operation.

32. A method according to claim 29, wherein the step of performing the first block write operation from the non-zero start address comprises the steps of:

storing the first non-zero start address as a write address to access a memory array of the memory device; then writing data to memory at the write address; then incrementing the write address; and wherein the steps of incrementing the write address and writing data to memory are carried out until the first block memory operation is completed.

33. A method according to claim 32, wherein the step of performing a first subsequent block memory operation from the non-zero start address stored at the memory device comprises the steps of:

storing the first non-zero start address as a memory address to access a memory array of the memory device; then performing a memory operation using the memory address; then incrementing the memory address; and wherein the steps of incrementing the memory address and performing a memory operation are carried out until the first subsequent block memory operation is completed.

34. A method according to claim 33, wherein the block memory operation is a write operation.

35. A method according to claim 33, wherein the block memory operation is a read operation.

* * * * *